(12) United States Patent
Edwards et al.

(10) Patent No.: US 7,733,337 B2
(45) Date of Patent: Jun. 8, 2010

(54) CIRCUIT FOR SIGNAL AMPLIFICATION AND USE OF THE SAME IN ACTIVE MATRIX DEVICES

(75) Inventors: Martin J. Edwards, Crawley (GB); John R. A. Ayres, Reigate (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 863 days.

(21) Appl. No.: 10/567,171

(22) PCT Filed: Jul. 30, 2004

(86) PCT No.: PCT/IB2004/002586
§ 371 (c)(1), (2), (4) Date: Feb. 3, 2006

(87) PCT Pub. No.: WO2005/015532
PCT Pub. Date: Feb. 17, 2005

(65) Prior Publication Data
US 2006/0232577 A1 Oct. 19, 2006

(30) Foreign Application Priority Data
Aug. 8, 2003 (GB) .................................. 0318611.1

(51) Int. Cl.
*G09G 5/00* (2006.01)
(52) U.S. Cl. .............................. 345/211; 326/88; 349/39
(58) Field of Classification Search .................... 326/62, 326/80, 82, 83, 88; 349/38, 39, 41, 42, 43
See application file for complete search history.

(56) References Cited

U.S. PATENT DOCUMENTS

| 5,694,369 | A | * | 12/1997 | Abe ......................... 365/210.1 |
| 5,909,262 | A | * | 6/1999 | Tomooka et al. .............. 349/39 |
| 6,788,108 | B2 | * | 9/2004 | Miyake et al. ................ 326/88 |
| 2005/0017929 | A1 | | 1/2005 | Sano et al. |
| 2005/0018503 | A1 | | 1/2005 | Sano |

* cited by examiner

*Primary Examiner*—Amr Awad
*Assistant Examiner*—John Morris

(57) ABSTRACT

An amplification circuit comprises a capacitor arrangement (42) and a switching arrangement. The capacitor arrangement has a first capacitor (C2) which has a voltage-dependent capacitance and a second capacitor (C1) (which may also be voltage-dependent). The circuit is operable in two modes, a first mode in which the input voltage is provided to one terminal of at least the first capacitor, and a second mode in which the switching arrangement causes charge to be redistributed between the first and second capacitors such that the voltage across the first capacitor changes to reduce the capacitance of the first capacitor, the output voltage being dependent on the resulting voltage across the first capacitor. The invention uses a voltage controlled capacitance in combination with charge sharing between capacitors, which has the result of providing a voltage amplification characteristic. This arrangement can thus be used for the amplification of an analogue voltage, or the boosting of a fixed level (i.e. digital voltage). Thus, the circuit of the invention can be used for level shifting or amplification, for example for use in the pixels of an active matrix array device.

24 Claims, 14 Drawing Sheets

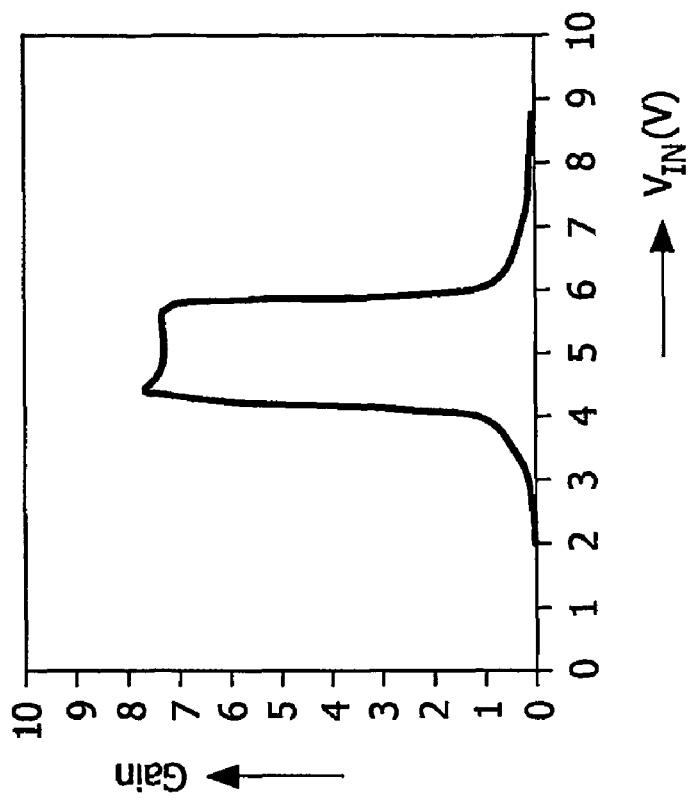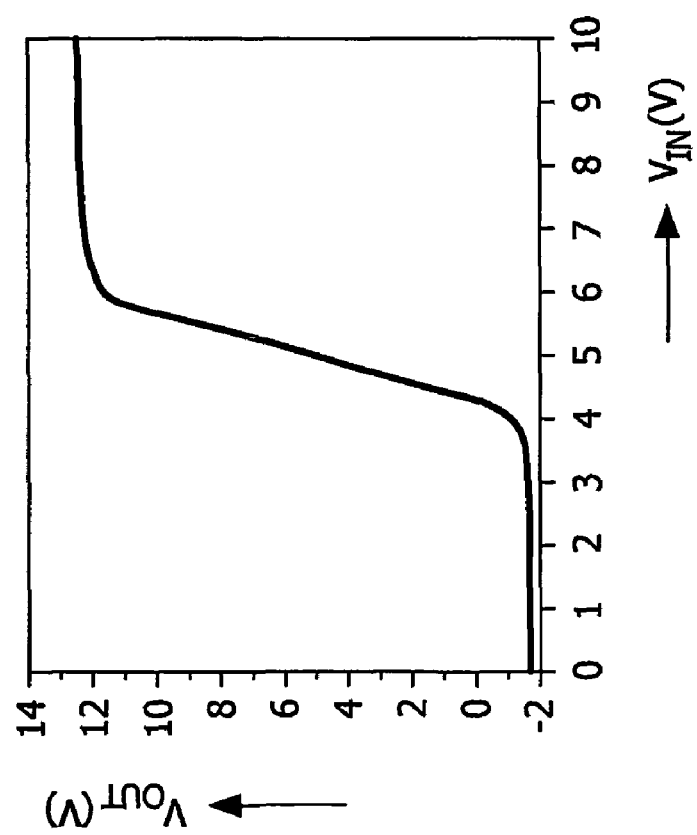
FIG. 13

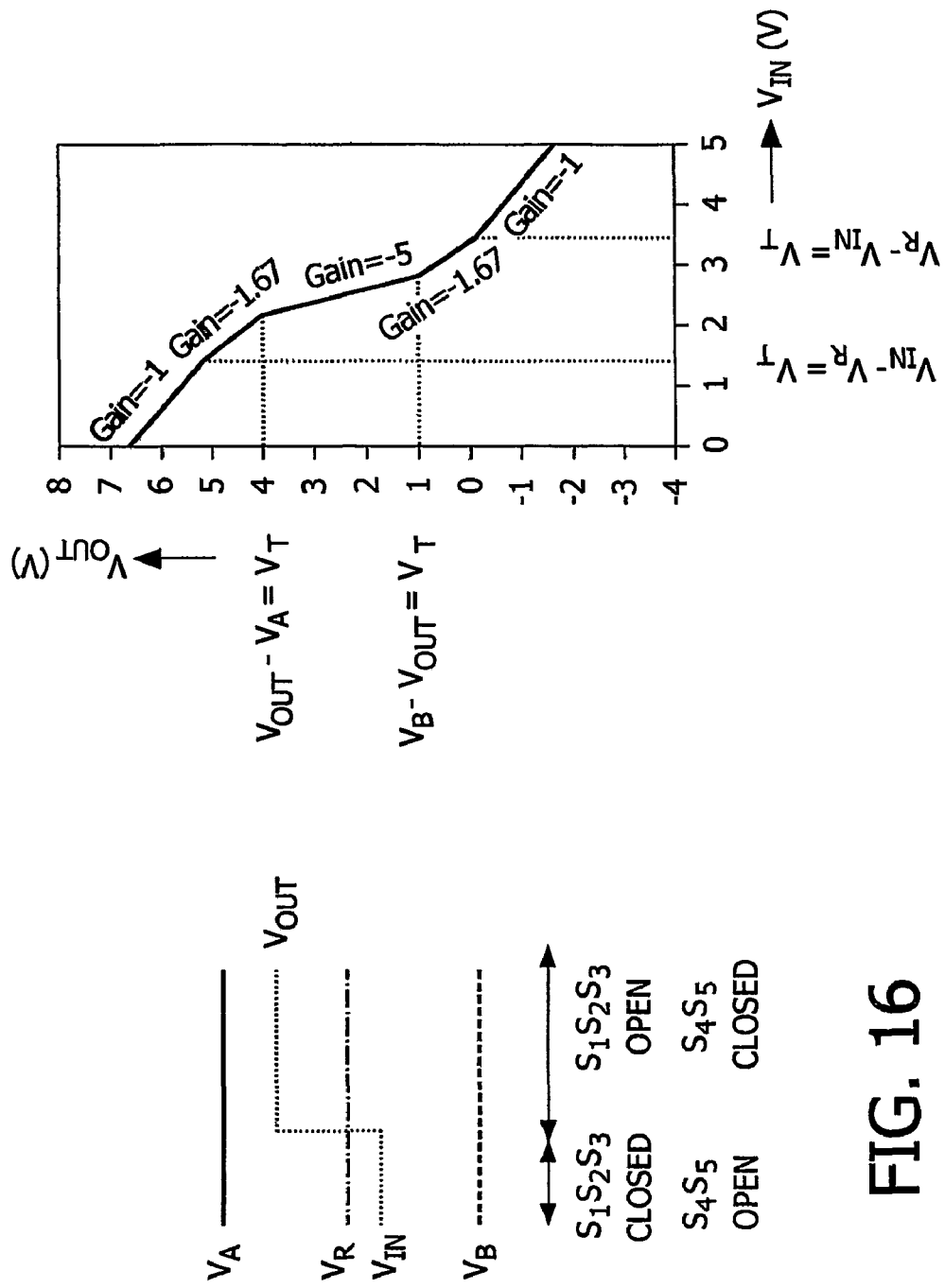

CIRCUIT FOR SIGNAL AMPLIFICATION AND USE OF THE SAME IN ACTIVE MATRIX DEVICES

This invention relates to amplification or voltage boosting circuits, and particularly using capacitive coupling effects. The circuits are particularly for use in active matrix array devices.

Active matrix array devices have found widespread use in a wide variety of applications. For example, they have been used as sensors, memories, and display devices, for example active matrix array liquid crystal (LC) display devices, or active matrix organic light emitting diode (OLED) displays.

In general, an active matrix array device typically includes a plurality of data conductors (for example columns), which are arranged to cross a plurality of addressing conductors (for example rows). A matrix array element is connected to both an addressing conductor and a data conductor at each intersection of these conductors. The elements in active matrix devices include a switch, typically in the form of a thin film transistor (TFT), for selectively switching a data signal to the remainder of the element, for example the display pixel, sensor cell or memory cell.

These cells typically include capacitive components which store a charge which is dependent on the data level.

The refresh rates in these devices (whether display, sensor, memory or other) typically require rapid turn on and off of the matrix element switch, and this in turn imposes requirements on the voltage levels used for switching the transistor switches sufficiently rapidly. Various circuits exist for boosting supply voltages to make them suitable for controlling the transistors. In-pixel signal amplification has also been proposed in various forms.

There is still a need for signal amplification circuits with a small number of components, thereby suitable for integration into the pixels/cells of array devices or suitable for boosting voltage levels.

According to the invention, there is provided an amplification circuit, comprising:
an input to which an input voltage is provided;
a capacitor arrangement; and
a switching arrangement,
wherein the capacitor arrangement comprises a first capacitor which has a voltage-dependent capacitance and a second capacitor,
wherein the circuit is operable in two modes, a first mode in which the input voltage is provided to one terminal of at least the first capacitor, and a second mode in which the switching arrangement causes charge to be redistributed between the first and second capacitors such that the voltage across the first capacitor changes to reduce the capacitance of the first capacitor, the output voltage being dependent on the resulting voltage across the first capacitor.

The invention uses a voltage controlled capacitance in combination with charge sharing between capacitors, which has the result of providing a voltage amplification characteristic. This arrangement can thus be used for the amplification of an analogue voltage, or the boosting of a fixed level (i.e. digital voltage). Thus, the circuit of the invention can be used for level shifting or amplification, and uses a low number of components to enable integration into the pixels of an array (if desired).

The switching arrangement may comprise an input switch for selectively coupling the input voltage to the capacitor arrangement, and wherein in the first mode the input switch couples the input voltage to the capacitor arrangement, and in the second mode the input switch isolates the input voltage to the capacitor arrangement. In the second mode a voltage on one terminal of the first and/or second capacitor is changed. Thus, this arrangement stores an input voltage on the capacitor arrangement, then changes control voltages to effect a charge sharing operation which changes the output voltage.

The change in voltage on the one terminal of the first capacitor preferably results in a reduction in the capacitance. This can be used to generate an increase in voltage.

The second capacitor may also be voltage-dependent, and in the second mode a voltage on one terminal of the second capacitor is also changed. This can be used to balance charge flow. For example, in the second mode a voltage on the one terminal of the first capacitor is increased and a voltage on the one terminal of the second capacitor is decreased.

The change in voltage on the one terminal of the second capacitor again preferably results in a reduction in the capacitance. The first and second capacitors may be identical.

In another arrangement, the switching arrangement comprises:
a first switch or switches coupling the input voltage to one terminal of the first and second capacitors;
second switches coupling respective control voltages to the one terminals of the first and second capacitors; and
an input switch coupling a reference voltage to the other terminals of the first and second capacitors.

In this arrangement, in the first mode the first switch or switches and the input switch are closed so that a voltage across the capacitors is dependent on the input voltage, and in the second mode the second switches are closed and the output voltage comprises the voltage on the other terminals of the first and second capacitors.

In another arrangement, the input is connected to one terminal of the first and second capacitors, and respective control voltages are coupled to the other terminals of the first and second capacitors through respective control switches of the switching arrangement. The switching arrangement preferably further comprises a shorting switch connected between the other terminals of the first and second capacitors.

In this circuit, in the first mode the control switches are closed and the voltages across the capacitors is dependent on the input voltage, and in the second mode the shorting switch is closed and the output voltage comprises the voltage on the other terminals of the first and second capacitors.

Generally, the or each voltage-dependent capacitor may comprise a transistor with source and drain connected together, and wherein the one terminal is defined by the gate and the other terminal is defined by the connected source and drain. This provides a voltage-dependent capacitor which is easily integrated with other transistor devices. For example, thin film MOS transistors may be used.

The input switch may be controlled by the voltage on the one terminal of the first capacitor. In this way, the timing control and control of the voltage dependency of the capacitor (or capacitors) is governed by a single control signal, which simplifies the control of the circuit and reduces the number of required control lines. The input switch may comprise a first transistor with the gate connected to the one terminal of the first capacitor. When a second voltage-dependent capacitor is used, the input switch may comprise a second transistors in parallel with the first transistor, and with the gate of the second transistor connected to the one terminal of the second capacitor.

The circuits of the invention may be used in an active matrix device comprising an array of device elements and circuitry for generating control signals for controlling the device elements. The circuit is then for increasing the voltage level of the control signals before supply to the device elements.

The circuits of the invention could also be used outside the array to provide level shifting of signals supplied from external ICs, for example control signals from a low voltage controller IC or digital data signals from an external memory IC. The level shifted signals might then be processed by integrated TFT circuits, for example digital to analogue converters within a column drive circuit.

In another application, the invention can be used in an active matrix display device comprising an array of display pixels, each display element having pixel refresh circuitry which includes the circuit of the invention for amplifying the gate voltage of a control transistor within the refresh circuitry.

For example, the refresh circuitry can comprise sensing circuitry for storing a display pixel voltage on a storage capacitor arrangement and writing circuitry for providing a voltage to the display pixel in dependence on the stored display pixel voltage, wherein the writing circuitry comprises the control transistor, the gate voltage of the control transistor being provided by the storage capacitor arrangement, and wherein the storage capacitor arrangement comprises the capacitor arrangement of the amplification circuit.

More generally the circuit of the invention can be used in an active matrix array device comprising an array of device elements, each device element in the array being provided with the circuit of the invention. The device elements may for example comprise memory cells, image sensing pixels, or display pixels.

The invention also provides a method of amplifying a signal, comprising:

providing an input signal to a capacitor arrangement comprising a first capacitor which has a voltage-dependent capacitance and a second capacitor, isolating the input signal from the capacitor arrangement; and changing a voltage on one terminal of the first capacitor, thereby changing the capacitance of the first capacitance and changing the output voltage.

Examples of the invention will now be described in detail with reference to the accompanying drawings, in which:

FIG. 13 shows the response of the circuit of FIG. 12;

FIG. 16 shows the control voltages for controlling the circuit of FIG. 14;

FIG. 17 shows the response of the circuit of FIG. 14;

The invention relates generally to circuits for amplifying signals. The invention is, however, concerned more specifically with amplification requirements in active matrix array devices. For this reason, one of the most common forms of active matrix device will first be described, as well as the specific issues concerning such devices which are addressed by this invention.

Figure 1:
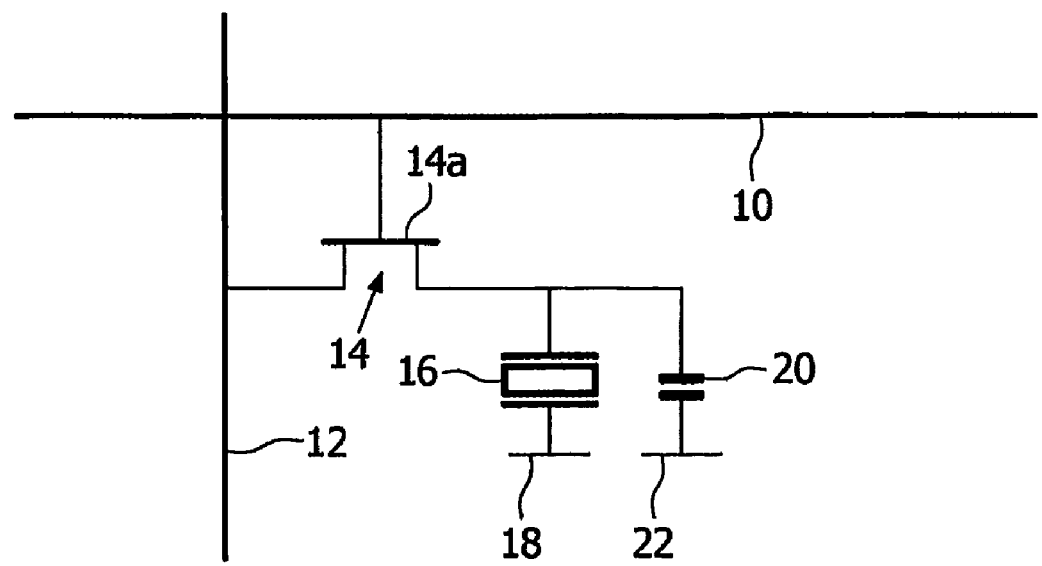
FIG. 1 shows a conventional pixel layout for an active matrix LC display.

FIG. 1 shows a conventional pixel configuration for an active matrix liquid crystal display. The display is arranged as an array of pixels in rows and columns. Each row of pixels shares a common row conductor 10, and each column of pixels shares a common column conductor 12. Each pixel comprises a thin film transistor 14 and a liquid crystal cell 16 arranged in series between the column conductor 12 and a common electrode 18. The transistor 14 is switched on and off by a signal provided on the row conductor 10. The row conductor 10 is thus connected to the gate 14a of each transistor 14 of the associated row of pixels. Each pixel additionally comprises a storage capacitor 20 which is connected at one end 22 to the next row electrode, to the preceding row electrode, or to a separate capacitor electrode. This capacitor 20 stores a drive voltage so that a signal is maintained across the liquid crystal cell 16 even after the transistor 14 has been turned off.

In order to drive the liquid crystal cell 16 to a desired voltage to obtain a required grey level, an appropriate analogue signal is provided on the column conductor 12 in synchronism with a row address pulse on the row conductor 10. This row address pulse turns on the thin film transistor 14, thereby allowing the column conductor 12 to charge the liquid crystal cell 16 to the desired voltage, and also to charge the storage capacitor 20 to the same voltage. At the end of the row address pulse, the transistor 14 is turned off, and the storage capacitor 20 maintains a voltage across the cell 16 when other rows are being addressed. The storage capacitor 20 reduces the effect of liquid crystal leakage and reduces the percentage variation in the pixel capacitance caused by the voltage dependency of the liquid crystal cell capacitance.

The rows are addressed sequentially so that all rows are addressed in one frame period, and refreshed in subsequent frame periods.

Figure 2:
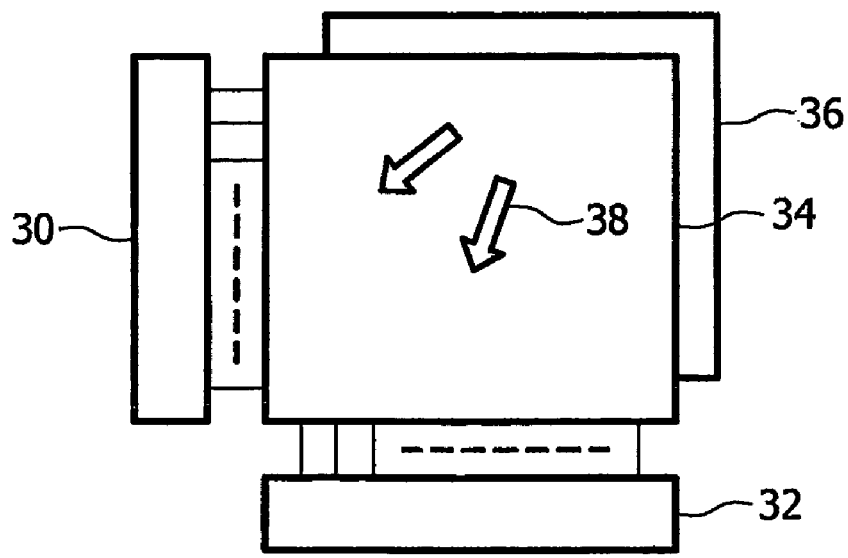
FIG. 2 shows a complete LC display.

As shown in FIG. 2, the row address signals are provided by row driver circuitry 30, and the pixel drive signals are provided by column address circuitry 32, to the array 34 of display pixels. The display has a backlight 36, and each liquid crystal cell 16 modulates (i.e. variably attenuates) the light from the backlight 36 to change the pixel image brightness (represented by arrows 38) viewed from the opposite side of the array 34 of display pixels. The array 34 constitutes an active matrix display module. Colour filters are used to provide red, green and blue pixels, enabling a colour display device to be formed.

This invention relates to the use of voltage dependent capacitors for amplifying signals. The, technique is of particular interest for use in the pixel circuit of large area matrix devices such as displays (as described above) and sensors where the use of conventional signal amplification techniques may be difficult due to limited TFT performance and limited space for the layout of circuits.

Figure 3:
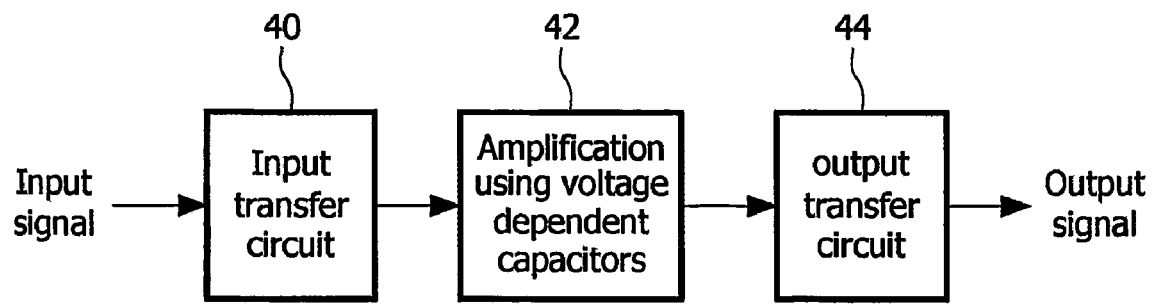
FIG. 3 shows schematically an amplifier circuit of the invention.

FIG. 3 shows schematically one general arrangement of the circuit of the invention. In this version of the invention, an input transfer circuit 40 is used to establish the input signal on an arrangement of capacitors 42 and an output transfer circuit 44 may be used to pass the amplified signal to other circuitry.

Figure 4:
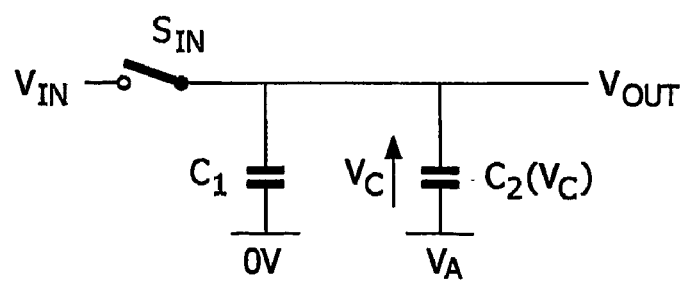
FIG. 4 shows one implementation of the circuit of FIG. 3.

A simple circuit which illustrates the principle of this approach is shown in FIG. 4. The input signal voltage is applied to the capacitors $C_1$ and $C_2$ through a switch $S_{IN}$. This switch represents the input transfer circuit 40. $C_1$ is a capacitor which has a constant value while $C_2$ is a capacitor having a capacitance which changes according to the voltage present across it. In a real circuit these capacitors may be real circuit elements or may represent the parasitic capacitances of the circuit, for example the layout capacitance of the circuit or the capacitance of switching devices such as thin film transistors. No output transfer circuit is shown in FIG. 4.

Figure 5:
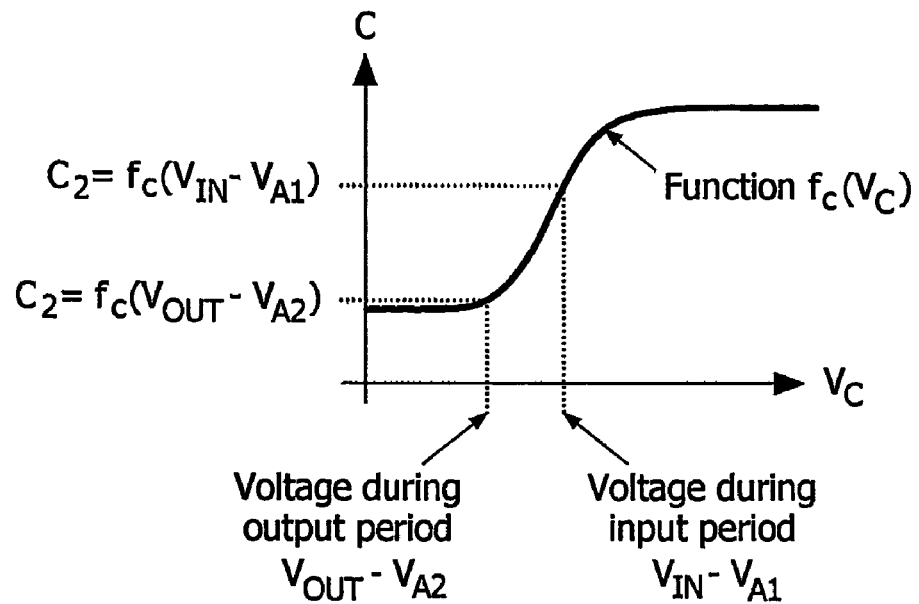
FIG. 5 shows the characteristics of the voltage dependent capacitor used in the circuit of FIG. 3.

The voltage dependent capacitor $C_2$ can be formed by a metal-oxide-semiconductor (MOS) capacitor. FIG. 5 illustrates how the capacitance of a MOS capacitor can vary with the voltage across it as function $f_C(V_C)$. When the applied voltage $V_C$ has a large positive value the capacitance tends towards a maximum value. When the applied voltage $V_C$ has a low value the capacitance decreases to a minimum value.

The function of the circuit of FIG. 3 is to operate at different points along the curve for an input period and for an output period. FIG. 5 illustrates a capacitor voltage $V_{OUT}-V_{A2}$ for the output period and a capacitor voltage $V_{IN}-V_{A1}$ for the input period.

Figure 6:
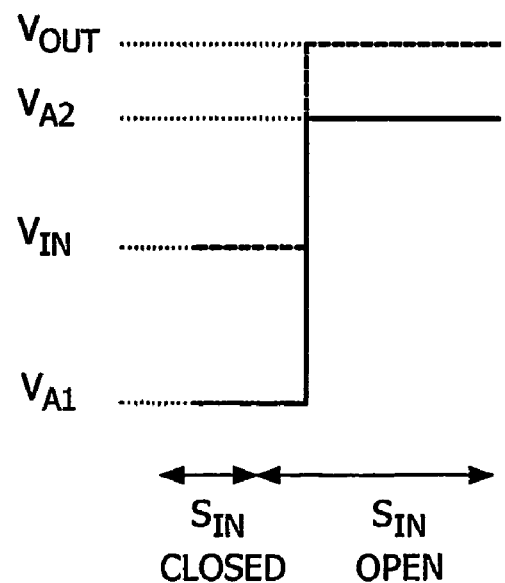
FIG. 6 shows the control voltages for controlling the circuit of FIG. 3.

The waveforms associated with the operation of the circuit are shown in FIG. 6. The first part of the circuit operation is that the switch $S_{IN}$ is closed for a period allowing the output node of the circuit to charge to the level of the input voltage, $V_{IN}$. The switch is then opened and the voltage applied to one side of the capacitor $C_2$ is changed from an initial level $V_{A1}$ to a higher level $V_{A2}$.

The effect that the change in the voltage $V_A$ has on the output voltage of the circuit can be evaluated by recognising that the change in the charge present on C1 and on C2 as a result of the transition in $V_A$ must be equal in magnitude and opposite in sign.

$$\Delta Q_1 = (V_{OUT} - V_{IN})C_1$$

$$\Delta Q_2 = \int_{V_{IN}-V_{A1}}^{V_{OUT}-V_{A2}} f_c(V) dV$$

$$\Delta Q_1 = -\Delta Q_2$$

Figure 7:
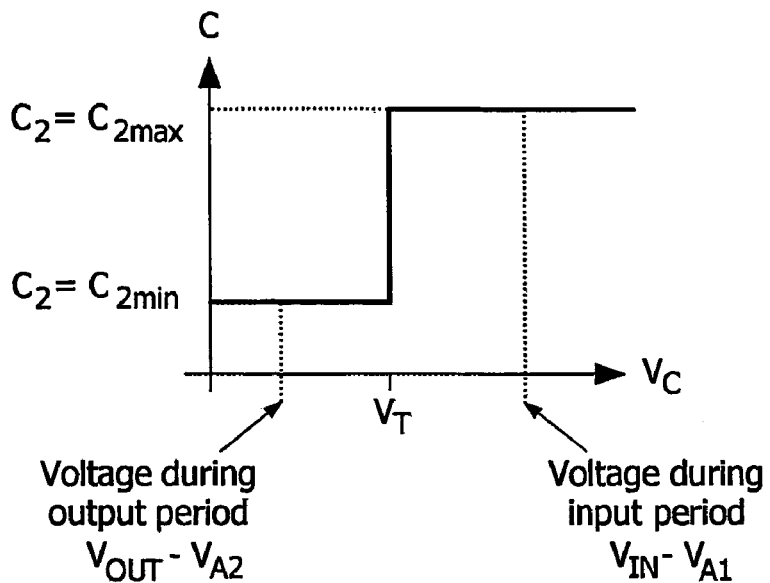
FIG. 7 shows a simplified model of the capacitor characteristics used for modeling the circuit response.

Consider the case where the voltage dependence of capacitor $C_2$ can be described by the simple step function shown in FIG. 7 which shows a threshold $V_T$ at which the step change in capacitance takes place between $C_{2max}$ and $C_{2min}$. $V_{A1}$ and $V_{A2}$ are selected so that during the input phase the voltage across $C_2$ is greater than the threshold voltage of the capacitor, $V_T$, and during the output phase the voltage across $C_2$ is less than the threshold voltage.

The output voltage can be related to the input voltage by equating the charge flow between $C_1$ and $C_2$.

$$\Delta Q_1 = -\Delta Q_2$$

$$(V_{OUT}-V_{IN})C_1 = C_{2min}(V_T-(V_{OUT}-V_{A2})) + C_{2max}((V_{IN}-V_{A1})-V_T)$$

$$V_{OUT}(C_1+C_{2min}) = V_{IN}(C_1+C_{2max}) + C_{2min}(V_T+V_{A2}) - C_{2max}(V_{A1}+V_T)$$

The maximum signal gain is therefore $$\text{Gain} = \frac{C_1 + C_{2max}}{C_1 + C_{2min}}$$

There is also an offset voltage $$\text{Offset} = \frac{C_{2min}(V_T + V_{A2}) - C_{2max}(V_{A1} + V_T)}{(C_1 + C_{2min})}$$

If $C_1$=0.05 pF, $C_{2max}$=0.1 pF, $C_{2min}$=0.02 pF then Gain=2.14.

Figure 8:
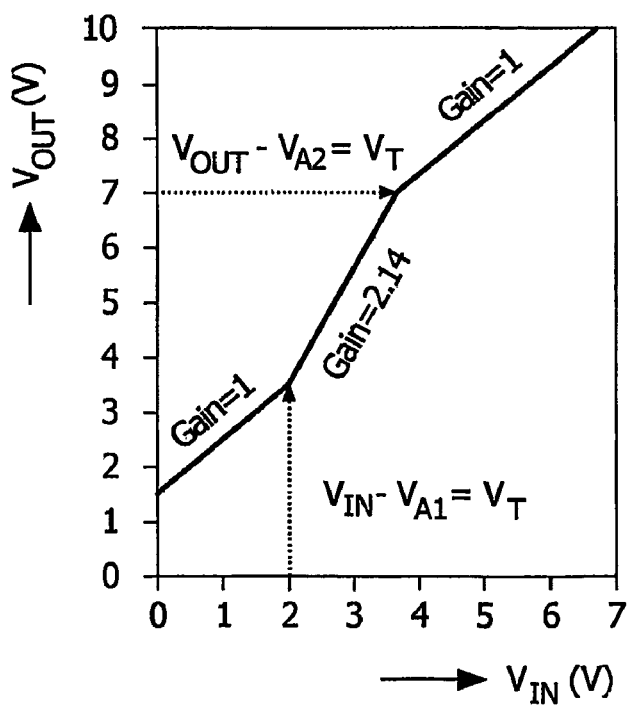
FIG. 8 shows the response of the circuit of FIG. 3 based on the model of FIG. 7 for the voltage dependent capacitor.

This gain is only achieved over a certain range of voltages. The way in which $V_{OUT}$ varies as a function of $V_{IN}$ is illustrated in FIG. 8 for the case where $V_{A1}$=0V, $V_{A2}$=5V and $V_T$=2V. The operation of this particular circuit is characterised by three regions. Over a certain range of input voltage the small signal gain of the circuit is equal to the calculated value of 2.14. However, if the input voltage falls below a certain value or increases above a second value then the gain falls to 1. The limits of the region where the small signal gain of the circuit is greater than one correspond to the points where the initial or final voltage across the capacitor $C_2$ is equal to the threshold voltage $V_T$. Beyond these limits the capacitance of C2 does not change value between the input and output periods and therefore the gain of the circuit falls to 1. The lower limit is when $V_{IN}-V_{A1}=V_T$ or alternatively $V_{IN}=V_T+V_{A1}$. The upper limit is when $V_{OUT}-V_{A2}=V_T$ or alternatively $V_{OUT}=V_T+V_{A2}$. To achieve the maximum signal gain the input signal range should be restricted to the range between these upper and lower limits however a gain of greater than one will still be achieved if at least part of the input signal range falls between these limits but the amplification will not be linear.

The well defined regions of operation which are illustrated in FIG. 8 reflect the step function characteristic of the capacitance shown in FIG. 7. In real circuits the capacitance variation is likely to be more gradual, as represented in FIG. 5 and this will have the effect of making the transition between these three operating regions less distinct.

Figure 9:
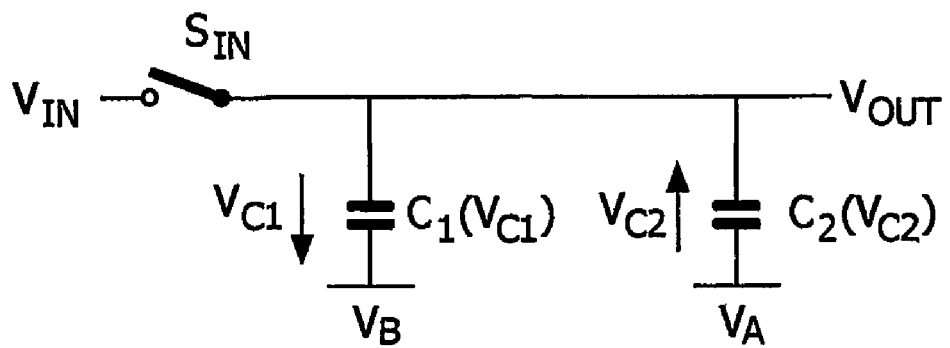
FIG. 9 shows a second implementation of the circuit of FIG. 3.
Figure 10:
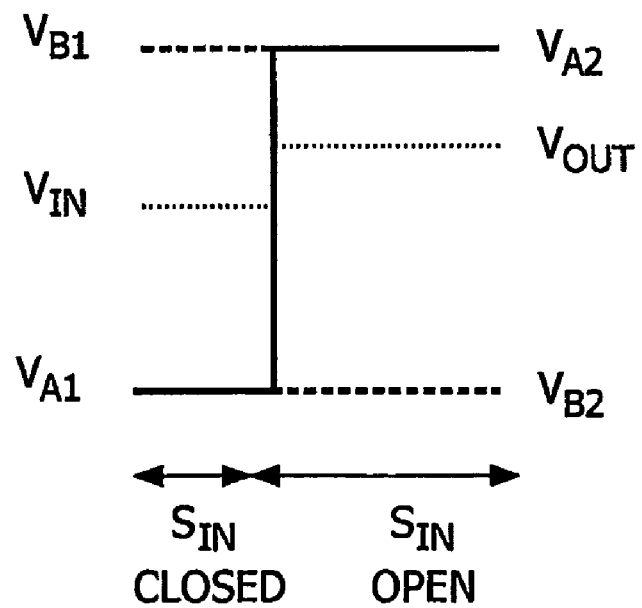
FIG. 10 shows the control voltages for controlling the circuit of FIG. 9.

It is possible to increase the gain and reduce the offset of the circuit by replacing $C_1$ with a second voltage dependent capacitor as shown in FIG. 9. This second voltage dependent capacitor is also arranged so that its capacitance is reduced during the output period. It is controlled by a second signal $V_B$ which is inverted compared to $V_A$ so that the coupling of the two signals onto the output node tends to cancel. If it is assumed that the voltage dependent capacitance of $C_1$ is of the same form as that of $C_2$ then in order to ensure that the value of $C_1$ decreases during the output period the connections of $C_1$ must be reversed compared to those of $C_2$. Waveforms associated with the operation of the circuit are illustrated in FIG. 10.

During the input phase $V_B$ is at a high level, $V_{B1}$, and $V_A$ is at a low level, $V_{A1}$. During the output phase $V_B$ is switched to a low level, $V_{B2}$, and $V_A$ is switched to a high level, $V_{A2}$, so that the capacitance of both $C_1$ and $C_2$ decreases. It may be convenient to set $V_{B1}=V_{A2}$ and $V_{A1}=V_{B2}$. Although the voltages $V_A$ and $V_B$ in FIG. 10 are shown to be switching simultaneously the amplification of the signal will still occur once both voltages reach their final values even if the voltages are switched at different times.

In the ideal case $S_{IN}$ should be open before or as VA and VB start to change in order to prevent charge flowing back through the switch to the source of the input voltage.

The gain of the circuit can be calculated in the same way as above:

$$\Delta Q_1 = -\Delta Q_2$$

$$-\int_{V_{B1}-V_{IN}}^{V_{B2}-V_{OUT}} f_c(V)dV = -\int_{V_{IN}-V_{A1}}^{V_{OUT}-V_{A1}} f_c(V)dV$$

$$C_{1min}(V_T - (V_{B2} - V_{OUT})) + C_{1max}((V_{B1} - V_{IN}) - V_T) =$$
$$\qquad C_{2min}(V_T - (V_{OUT} - V_{A2})) + C_{2max}((V_{IN} - V_{A1}) - V_T)$$

$$V_{OUT}(C_{1min} + C_{2min}) = V_{IN}(C_{1max} + C_{2max}) - C_{1min}(V_T - V_{B2}) -$$
$$\qquad C_{1max}(V_{B1} - V_T) + C_{2min}(V_T + V_{A2}) - C_{2max}(V_{A1} + V_T)$$

$$\text{Gain} = \frac{C_{1max} + C_{2max}}{C_{1min} + C_{2min}}$$

$$\text{Offset} = \frac{-C_{1min}(V_T - V_{B2}) - C_{1max}(V_{B1} - V_T) + C_{2min}(V_T + V_{A2}) - C_{2max}(V_{A1} + V_T)}{(C_{1min} + C_{2min})}$$

For example if $C_{1max}=C_{2max}=0.1$ pF, $C_{1min}=C_{2min}=0.02$ pF then Gain=5.

Figure 11:
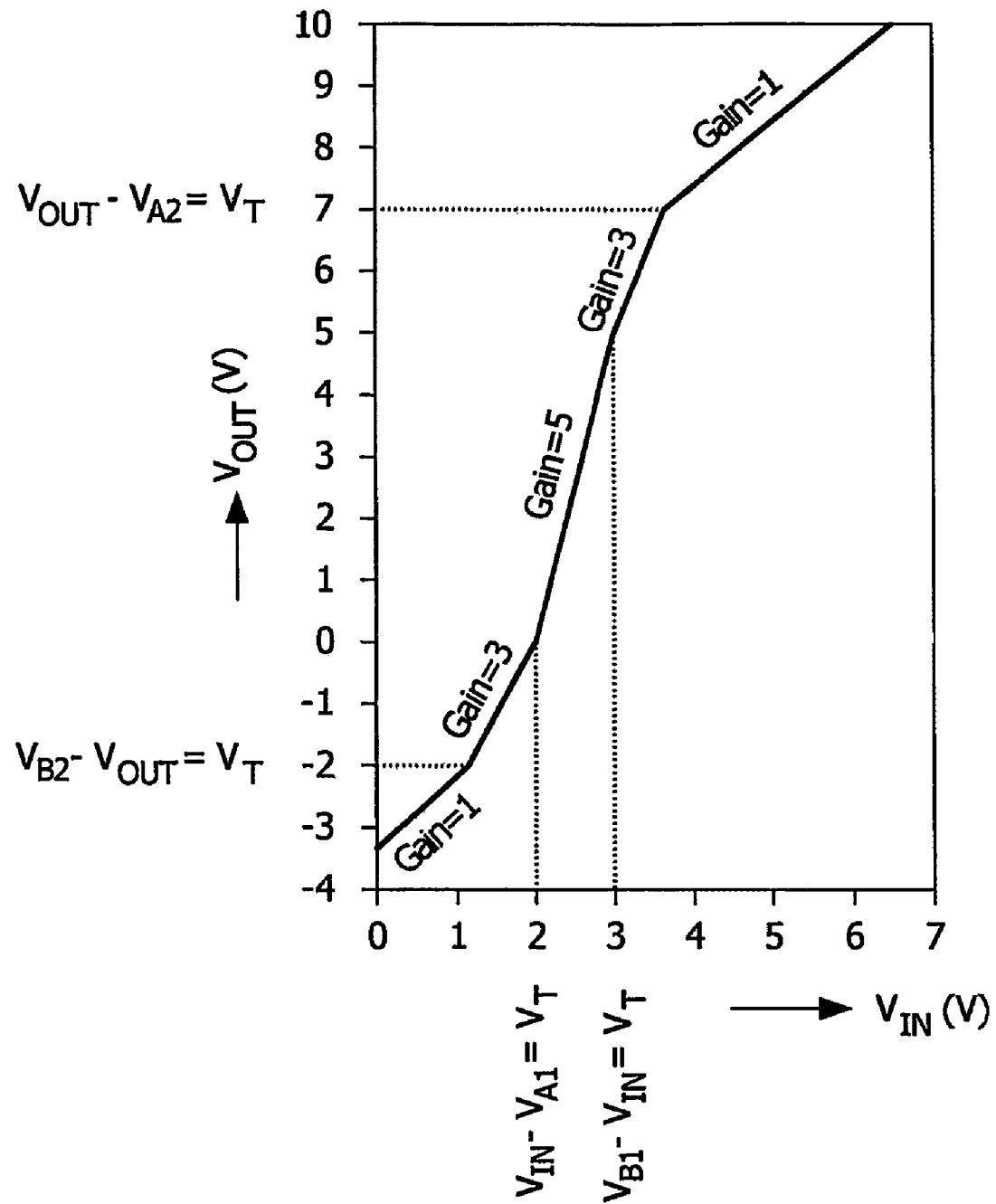
FIG. 11 shows the response of the circuit of FIG. 9 based on the model of FIG. 7 for the voltage dependent capacitors.

The way in which $V_{OUT}$ varies as a function of $V_{IN}$ is illustrated in FIG. 11 for the case where $V_{A1}=V_{B2}=0V$, $V_{A2}=V_{B1}=5V$ and $V_T=2V$. The operation of the circuit is characterised by five regions. Over a certain range of input voltage the small signal gain of the circuit is equal to the calculated value of 5 however if the input voltage falls below a certain value or increases above a second value then the gain falls to 3. If the input voltage is increased above a further upper limit and below a further lower limit then the gain reduces to 1. The points at which the gain of the circuit changes value are again related to the voltages across the voltage dependent capacitors during the input and output periods. Two points are associated with each capacitor corresponding to the situation where the initial voltage across the capacitor is equal to $V_T(V_{IN}=V_T+V_{A1}$ and $V_{IN}=V_{B1}-V_T)$ and when the final voltage across the capacitor is equal to $V_T(V_{OUT}=V_T+V_{A2}$ and $V_{OUT}=V_{B2}-V_T)$. The reason why the gain is reduced for certain input voltage levels is, as before, that the capacitance of one or both of the voltage dependant capacitors does not change between the input and output periods. To achieve the maximum gain the capacitance of both voltage dependent capacitors must reduce between the input and output periods.

The offset voltage of the circuit depends on the relative values of $C_1$ and $C_2$ as well as the voltage levels of signals $V_A$ and $V_B$. It may be desirable to vary the values of these parameters in order to adjust the offset voltage to a value which is appropriate for a given circuit situation.

Figure 12:
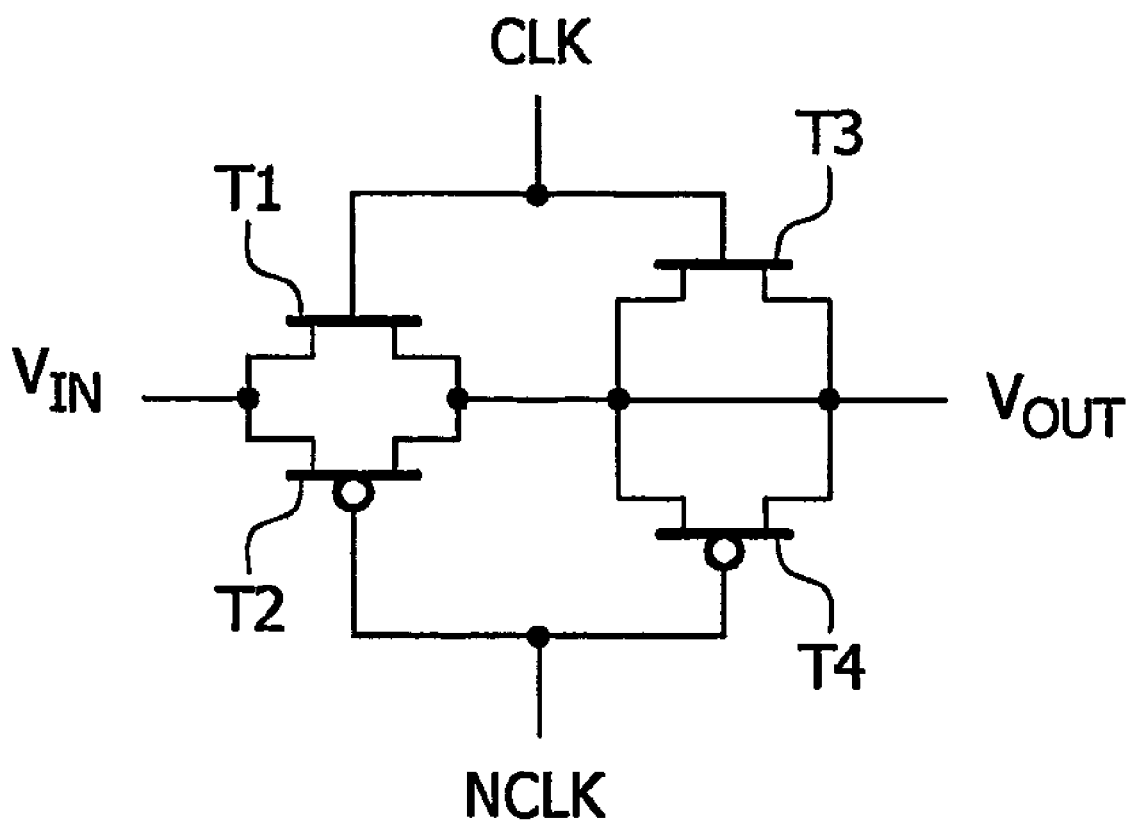
FIG. 12 shows a circuit implementation of the circuit of FIG. 9.

As mentioned above, one possible use of the circuit is for integration into the pixels of an array device. A possible implementation of the amplifying circuit of FIG. 9 using polycrystalline MOS transistors is shown in FIG. 12.

The circuit is formed using a combination of p-type and n-type polycrystalline silicon thin film transistors. The switch which is used to apply the input voltage to the output node during the input period is a CMOS transmission gate formed by the transistors T1 and T2. The gates of these transistors are driven with complementary clock signals CLK and NCLK. Although a CMOS transmission gate is shown, p-type or n-type transistors alone could be used to form the switch. Voltage dependent capacitors which are connected to the output node are formed using the two transistors T3 and T4. The source and drain connections of each transistor are shown as being connected together although in principle it would be sufficient to connect only one end of each transistor with the second terminal left disconnected. Complementary transistors are used although a single transistor type could alternatively be used as long as the connections to the gate and source and/or drain are arranged appropriately to provide the desired reduction in capacitance between the input and output periods. In this example circuit, the gates of T3 and T4 are connected to the two switch control signals CLK and NCLK.

When the signal CLK is high and NCLK is low the transmission gate formed by T1 and T2 is turned on and the input voltage is transferred to the capacitors formed by T3 and T4. If the voltage difference between the signal CLK and the input voltage has a positive value which is greater than the threshold voltage of the n-type transistor then T3 will have a relatively large capacitance. Similarly if the voltage difference between the signal NCLK and the input voltage has a negative value which is greater than the threshold voltage of the p-type transistor then T4 will have a relatively large capacitance. When the levels of CLK and NCLK switch so that CLK is low and NCLK is high the transmission gate turns off and the output node becomes isolated from the input voltage. At the same time the changing voltage levels of CLK and NCLK alters the voltages appearing across the capacitors T3 and T4. When the input voltage lies within an appropriate range the voltages across the capacitors will fall below the threshold voltages of the transistors and therefore their capacitance will become reduced, amplifying the sampled input signal.

The results of simulations of this circuit are shown in FIG. 13. This illustrates how the output voltage and the gain vary with the input voltage for the case where CLK and NCLK switch between voltages of 0V and 10V. The threshold voltages of the TFTs are approximately 3V for n-type and −3V for p-type. T1 and T2 have widths of 5 μm while T3 and T4 have widths of 40 μm. The length of all TFTs is 5 μm.

In FIG. 12, the TFT capacitors are driven with the same signals that control the input switch transistors. Separate control signals can be used, for example to delay the switching of signals on the TFT capacitors with respect to the switching of the TFT input switches. This may be desirable to compensate for slew rates of the switching signals.

In the circuit of FIG. 9, the input signal is applied to one terminal of both capacitors through an input switch. There are several other ways in which the signal voltage can be applied to the capacitor arrangement. For example, in addition to applying the input voltage to the node which is common to the two voltage dependent capacitors. it could alternatively be applied to the node where the control voltage $V_A$ is connected or to the node where the control voltage $V_B$ is connected, or to both of these nodes. What is important is that the input voltage must affect the voltage appearing across at least one (and preferably all) of the voltage dependent capacitors during the input period.

Figure 14:
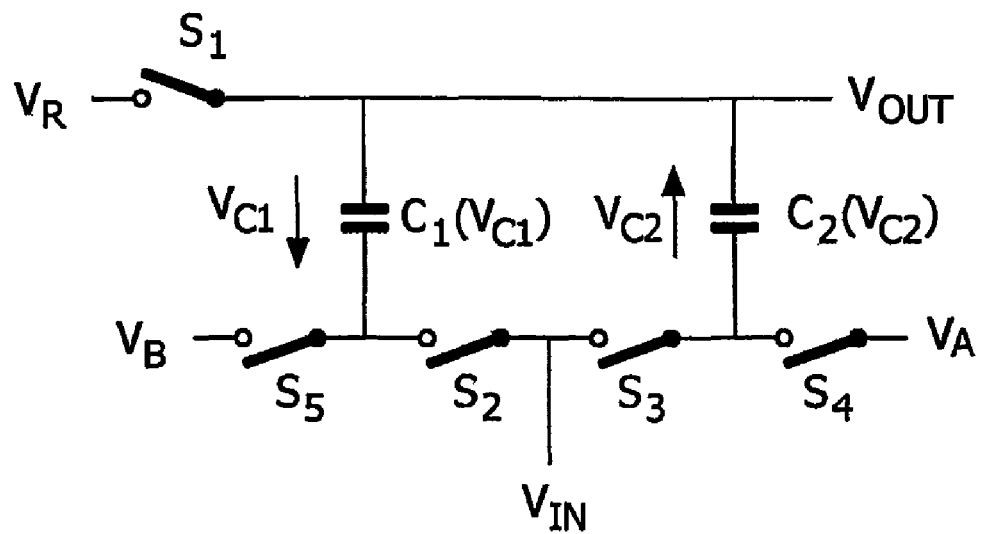
FIG. 14 shows another example of circuit of the invention.

FIG. 14 shows the same capacitor arrangement as FIG. 9 but with additional switches to allow the input signal to be applied to the opposite terminals of both voltage dependent capacitors during the input period. In fact, the additional switches in FIG. 14 would already be present in the circuits for generating $V_A$ and $V_B$, so that the circuit of FIG. 14 does not in fact complicate significantly the overall circuitry required. At the same time, the node which is common to the two capacitors is charged to a reference potential $V_R$.

The circuit thus has a first input switch SI coupling the reference voltage $V_R$ to the common capacitor terminal. Second and third switches $S_2$ and $S_3$ couple the input voltage to the opposite terminal of each capacitor. Third and fourth switches $S_4$ and $S_5$ couple the control voltages $V_A$ and $V_B$ to their respective capacitors.

Figure 15:
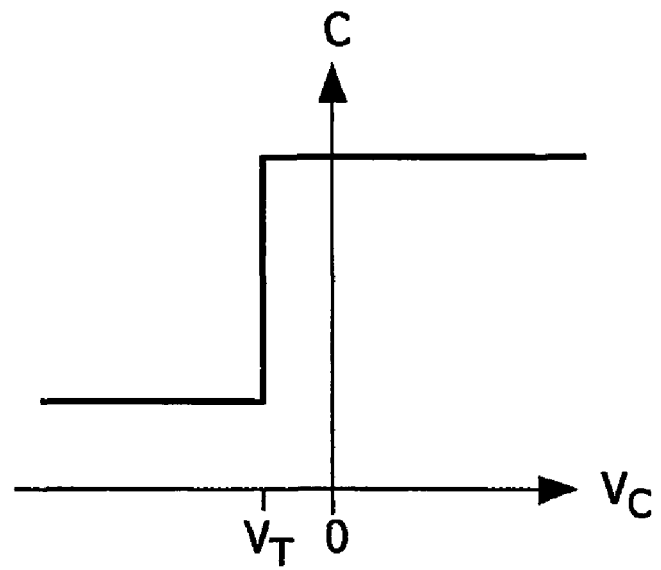
FIG. 15 shows the characteristics of the voltage dependent capacitors used in the circuit of FIG. 14.

In the following analysis, it is assumed that the voltage dependent capacitors are formed from depletion n-type MOS devices having an idealised capacitance verses applied voltage characteristic of the form shown in FIG. 15.

The threshold voltage of the depletion MOS capacitor is negative. When the voltage across the capacitor is more negative than this threshold voltage the capacitor has a low value of capacitance, and when the voltage across the capacitor is more positive than the threshold voltage the capacitor has a higher capacitance value.

During the input period, the switches $S_1$, $S_2$ and $S_3$ are closed while $S_4$ and $S_5$ are open. Thus, the reference voltage is stored on one side of each capacitor, and the input voltage is stored on the other side of each capacitor. The value of the reference voltage $V_R$ is chosen so that during the input period the two voltage dependent capacitors have the higher capacitance value. When charging is complete, $S_1$, $S_2$ and $S_3$ are opened and then during the output period $S_4$ and $S_5$ are closed. Thus, the control voltages are applied to the other sides of the two capacitors.

The levels of $V_A$ and $V_B$ are chosen so that the voltages across the voltage dependent capacitors become more negative than the threshold voltage during the output period and therefore the capacitance values of these capacitors falls to the lower value. The relative levels of the different voltages are illustrated by the waveforms in FIG. 16.

FIG. 17 illustrates how the output voltage of the circuit varies with the input voltage for the case where the higher value of capacitance of the voltage dependent capacitors is 0.1 pF, the lower value of capacitance is 0.02 pF, VA=5V, $V_B$=0V, $V_R$=2.5V and $V_T$=−1V. As in the case of the circuit of FIG. 9, the maximum gain has a magnitude of 5 but in this modified circuit the gain is negative and the circuit behaves as an inverting amplifier. This inversion occurs because the node to which the input signal is applied and the node from which the output signal is taken are on apposite sides of the capacitors.

This example shows that the circuit of the invention can also be designed to achieve negative gain, but also shows that the control voltages can be applied to the same terminals of the capacitors as the input voltage.

It is not necessary to apply the input signal to both of the capacitors in the circuit of FIG. 14. If the signal is only applied to one capacitor then the gain will be reduced.

It would also be possible to amplify the difference between two signals using this circuit by applying a second input signal in place of the reference voltage. The output voltage would then represent the amplified difference between the two input signals.

In the examples above, the input signal is applied to the capacitor arrangement through an input switch, so that during an input phase the input voltage is coupled to the capacitor arrangement and during an output phase the input voltage is isolated from the capacitor arrangement.

In fact, it is not essential to apply the input signal to the capacitors through an input switch.

Figure 18:
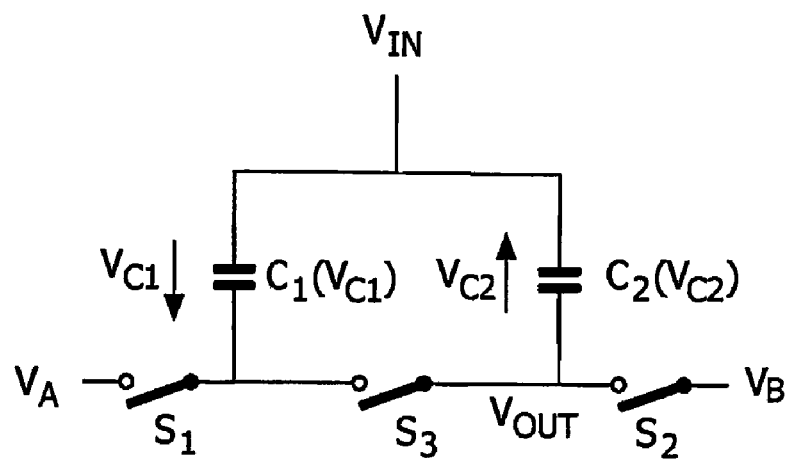
FIG. 18 shows another example of circuit of the invention.

FIG. 18 shows a circuit where a low impedance input voltage source is applied directly to two voltage dependent capacitors.

The capacitors $C_1$ and $C_2$ are again in parallel, with one terminal of each capacitor connected to the input voltage, but in this circuit there is no input switch. The other terminal of each capacitor is connected to a control terminal $V_A$ and $V_B$ through a respective switch $S_1$ and $S_2$. These other terminals form the output of the circuit as will be apparent below. A further switch $S_3$ is provided between the other terminals of the two capacitors, and in this circuit the charge redistribution between the two capacitors is achieved by switching the connection $S_3$ between the capacitors rather than by changing the voltages applied to them.

The threshold voltage of the capacitors is assumed to be +2V as for the circuit of FIG. 9.

During the input period, switches $S_1$ and $S_2$ are closed so that the capacitors $C_1$ and $C_2$ become charged to voltages which depend on the input signal voltage. The values of $V_A$ and $V_B$ are chosen so that the voltage across both $C_1$ and $C_2$ is greater than the threshold voltage of 2V and therefore both capacitors initially have a higher value of capacitance. During the output period, $S_1$ and $S_2$ are opened and then $S_3$ is closed. Charge redistribution takes place between $C_1$ and $C_2$ causing the voltages across the capacitors to fall below the threshold voltage and therefore resulting in a reduction in the capacitance of both $C_1$ and $C_2$. The output signal is taken from the common connection of $C_1$ and $C_2$ which is on the opposite side of the capacitors to the one where the input signal is connected.

Figure 19:
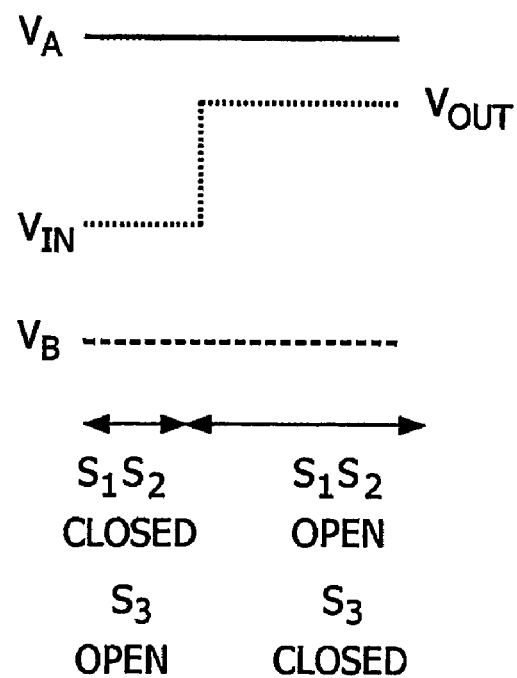
FIG. 19 shows the control voltages for controlling the circuit of FIG. 18.

As in the previous example, this results in the circuit having a negative gain. The relative levels of the voltages present during the operation of the circuit are shown in FIG. 19.

Figure 20:
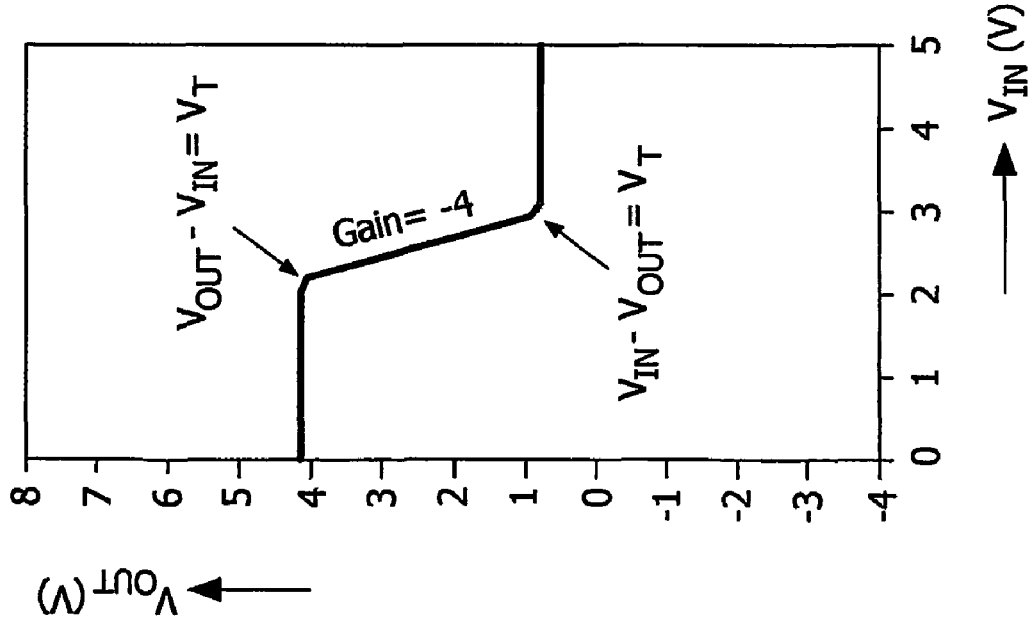
FIG. 20 shows the response of the circuit of FIG. 18.

FIG. 20 shows how the output voltage of the circuit varies with the input voltage for the case where the higher value of capacitance of the voltage dependent capacitors is 0.1 pF, the lower value of capacitance is 0.02 pF, $V_A$=10V, $V_B$=−5V and $V_T$=2V. The maximum gain of the circuit is −4 and this value of gain is achieved between the limits where the difference between input voltage and the output voltage is less than ±$V_T$. When the circuit operates outside these limits the capacitance of either C1 or C2 does not change to the lower value during the output period.

There are a number of possible uses of the circuits of the invention in the field of active matrix array devices. A first example will now be given for level shifting of digital data.

Figure 21:
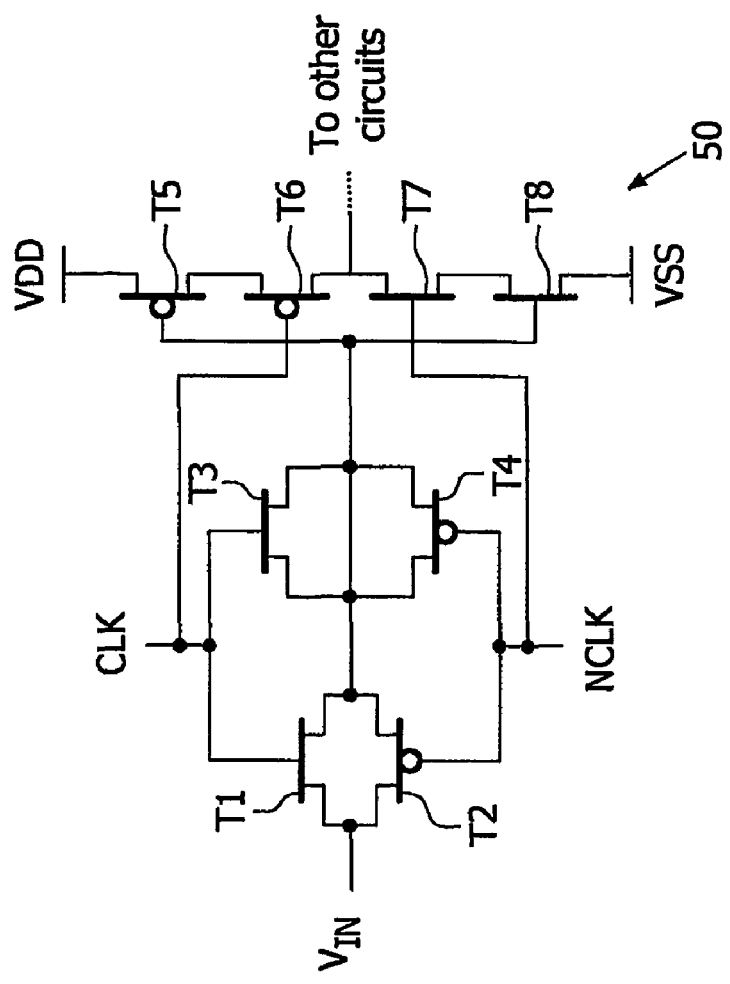
FIG. 21 shows the circuit of FIG. 12 with an output buffer.

Thin film transistor circuits formed on the substrates of active matrix LC displays typically operate with higher power supply voltages than the conventional crystalline silicon ICs which are used to control them. Level shifting circuits which are integrated onto the display substrate are used to interface the low voltage digital signals from the control IC to the higher voltage TFT circuits. FIG. 21 shows a possible level shifting circuit which is based on the amplifying circuit of FIG. 12.

The output transfer circuit of the amplifier is implemented by a clocked CMOS inverter 50 which is formed by transistors T5 to T8. The output voltage of the level shifting circuit is only valid during the output period of the amplifier and the clock signals to the clocked inverter are arranged so that the output of the inverter is low impedance during this output period.

Figure 22:
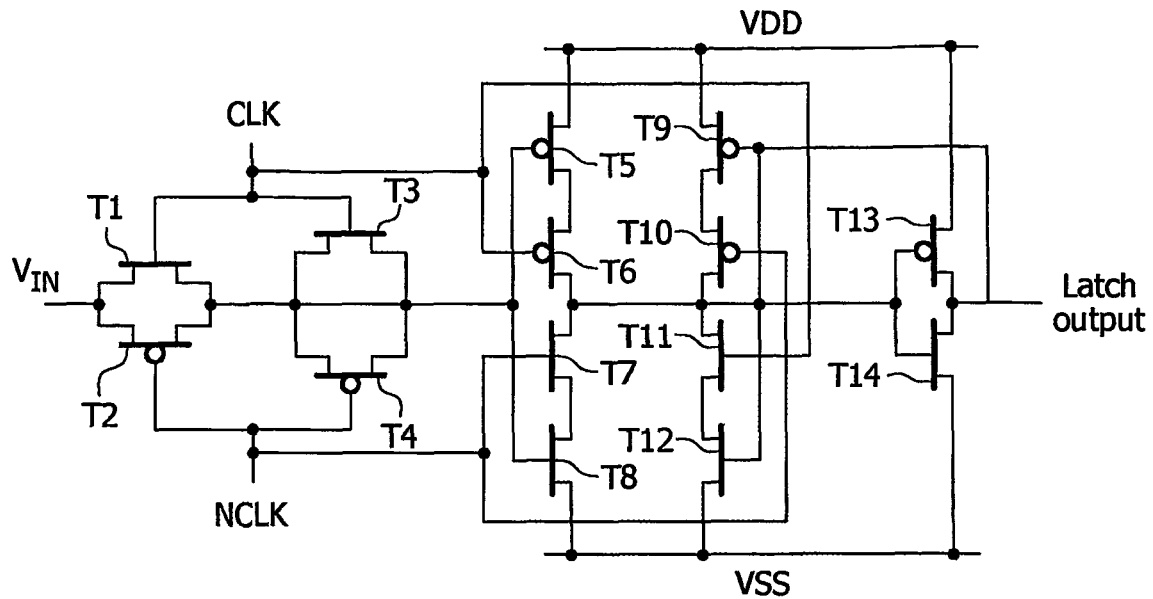
FIG. 22 shows the circuit of FIG. 12 with an output latch.

In order to provide a continuous data output it may be desirable to implement a latch circuit at the output of the level shifting circuit as shown in FIG. 22.

If the voltage levels of CLK and NCLK are the same (VDD and VSS), the threshold voltages of the capacitor TFTs T3 and T4 are equal in magnitude and the width and length of T3 and T4 are equal then the input switching voltage of the level shifter will be mid way between VDD and VSS. In practice it may be more convenient if the input switching voltage has a different value, for example closer to VSS. Some variation of the input switching voltage can be achieved by changing the relative width and length of T3 and T4. However, if the input voltage is required to switch at a voltage which is very close to VSS then the transistor T4 may no longer be biased above its threshold voltage during the input period of the amplifier. This problem can be avoided by using a voltage dependent capacitor in place of T4 which has a capacitance which is relatively high when the voltage across the device is low. This could be, for example, an NMOS depletion mode transistor. In the case of an n-type depletion mode device the gate of the transistor could be connected to the output node of the amplifier circuit and the source and drain connected to the signal NCLK.

The circuit of the invention can be used as a level shifter for providing voltage levels externally of the display area (34 in FIG. 2) for example for use in generating the row voltage waveforms. The circuit of the invention can also be used within the individual pixels of an array device. One particular application is within refresh circuitry within the pixels of an AMLCD. The use of refresh circuitry in LCD pixels is a relatively recent development, and is driven by the desire to reduce power consumption.

Active matrix array devices, and in particular active matrix array display devices, have found widespread use in battery powered electronic devices like lap-top computers, mobile phones, personal digital assistants and so on. In such devices, reduction of power consumption is an important issue.

A significant part of the power consumption of an active matrix array device originates from the charging of the matrix array elements. Especially in large area active matrix array devices or in active matrix array devices having a large number of row and column conductors, each of the conductors has a relatively large capacitance, and charging the matrix array elements can consume significant amounts of power, because the column conductor capacitances may have to be charged and discharged numerous times to sequentially store the appropriate charges in all the associated matrix array elements in one addressing cycle of the active matrix array device.

This is particularly wasteful in situations where the data values stored in the respective matrix array elements do not change and are periodically overwritten with the same data values. This can for instance occur in situations where the active matrix array device is required to produce a constant output over a prolonged period of time, for instance because the electronic device of which the active matrix array device forms a part of, is switched to a standby state.

To provide this saving in power consumption, a low power operating mode can be implemented, in which each pixel of the display is operated as a self refreshing dynamic memory cell. Reductions in power consumption can be achieved when there is no need to replace the charges stored with every field period.

Figure 23:
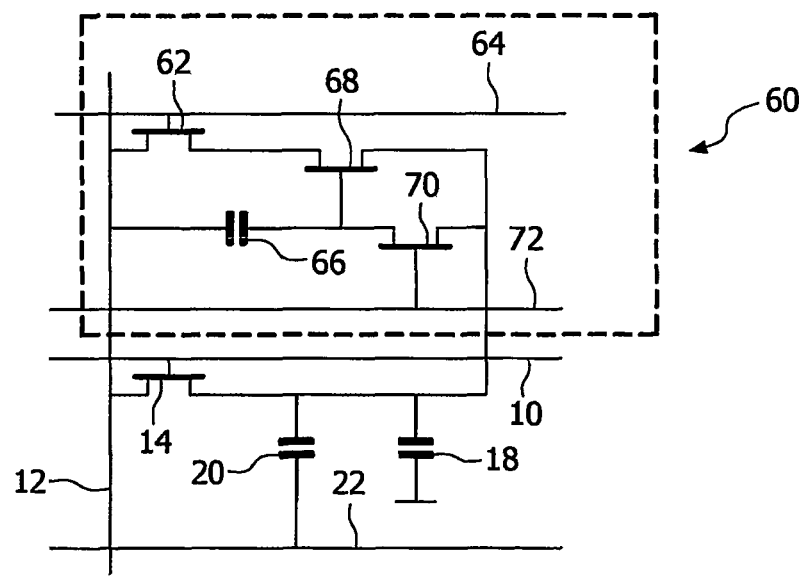
FIG. 23 shows a proposed LCD pixel layout with a pixel refresh circuit.

FIG. 23 shows a pixel configuration proposed by the applicant. The basic pixel elements of FIG. 1 are repeated in FIG. 23 with the same reference numerals.

Each pixel has refresh circuitry 60 coupled to the pixel electrode (the common terminal of the LC cell 18 and storage capacitor 20). This refresh circuitry comprises a second input transistor 62 which is controlled at its gate by a refresh control line 64. In series with the second input transistor 62 is a further transistor 68. The transistors 62 and 68 are thus connected in series between the column 12 and the pixel electrode and they allow the transfer of voltage from the column to the pixel electrode by a different mechanism to the normal pixel circuit elements 10, 14.

A second storage capacitor 66 stores the gate voltage of the transistor 68 and thus controls the switching of the transistor 68. The capacitor acts as an in-pixel memory element, and the pixel electrode voltage can be stored on this capacitor 66 by means of a further transistor 70. In this way, the capacitor 66 can be used to sample the pixel electrode voltage, and the capacitor voltage can also be used to control the application of a voltage from the column 12 to the pixel electrode (by controlling the switching of transistor 68). A sense control line 72 controls the gate voltage of the transistor 70.

The operation of the circuit will become apparent in more detail from the description below.

Before the low power mode commences, data is first written to the pixel in conventional manner. However, the data voltage might typically take only one of two values, for example 0V or 5V. The low power mode in this way provides an image in which grey scale information is lost.

In order to minimise the power consumption of the display it is desirable to suspend the transfer of data to the pixels during certain time periods, so that the charge transfer between capacitances in the pixel circuits at each frequent refresh cycle is avoided. However, over time the charge applied to the pixel capacitance will leak away through the thin film transistors or the liquid crystal. In order to avoid this the data must be periodically refreshed (but less frequently than the normal refresh rate) and this is achieved using the pixel refresh circuitry 60 which is integrated within each pixel of the display.

Although a lower refresh frequency may be used in order to reduce the power consumption, even if the refresh frequency is the same as the normal addressing frequency there can still be a power saving because a number of rows of pixels can be refreshed simultaneously. This reduces the frequency of the voltage waveforms appearing on the columns and common electrode of the display and therefore reduces power consumption.

A typical refresh operation is carried out in the following way. The previously applied data voltage (the 0V or 5V in the example above) is first temporarily stored on the second capacitor 66. This is achieved by taking the sense control line 72 to a high voltage level, turning on transistor 70. Charge sharing takes place between the three capacitors 18, 20 and 66. As the pixel capacitance (18 and 20) is significantly larger than the capacitance of capacitor 66, the resulting voltage on capacitor 66 is substantially equal to the data voltage level. During this time, 0V is applied to the column conductor 12. Transistor 70 is then turned off, and the data is temporarily stored on capacitor 66.

The pixel capacitance is then charged to the high data voltage level, 5V, by applying this voltage to the column conductor 12 and briefly turning on transistor 14.

The operation of the circuit is to invert the data stored on capacitor 66 and return this to the pixel capacitance by taking the voltage on the column electrode 12 to the low data voltage level and taking the refresh line 64 to a high voltage level, turning on transistor 62.

If the data voltage stored on capacitor 66 is low, close to 0V, then transistor 68 is turned off, and the pixel remains at the high data level, which is the inverse of the data stored on 66. If the data voltage stored on 66 is high, close to 5V, then transistor 68 is turned on and the pixel capacitance is discharged to the low data voltage level on the column conductor 12, which is the inverse of the data stored on capacitor 66.

The operation of this circuit is based on a common electrode drive scheme, so that the common electrode 22 is switched between approximately 0V and approximately 5V depending on the polarity of drive being applied to the LC. The voltages of 0V and 5V applied to the pixel will provide a light or dark output depending on the drive polarity.

Thus, if the common electrode is approximately 5V (negative drive to LC) then a pixel voltage of 0V corresponds to a dark pixel (high rms voltage on LC), a pixel voltage of 5V corresponds to a light pixel (low rms voltage on LC). If the common electrode is approximately 0V (positive drive to LC) then a pixel voltage of 5V corresponds to a dark pixel, a pixel voltage of 0V corresponds to a light pixel.

The timing of the switching of the voltage on the common electrode is important to the operation of the refresh circuit. At the start of the refresh operation, when the pixel voltage is sampled onto capacitor 66, the common electrode must be at the same voltage as when the pixel was last addressed or refreshed. After the sample is taken and before or while the pixel is being charged to 5V the voltage on the common electrode must be switched to the other level.

It is important to the operation of the pixel circuit that the difference in the data high and data low voltage levels at the gate of transistor 68 is sufficient to switch the device between conducting and non-conducting states. If the threshold voltage of transistor 68 is too large compared to the data voltage range at the gate then the refresh operation will not be carried out correctly. When the data voltage is transferred to 66 from the pixel capacitance charge sharing takes place which can reduce the amplitude of the data signal.

If this reduction in signal amplitude is too large then the signal may become insufficient to switch 68 and the refresh operation might also fail.

Figure 24:
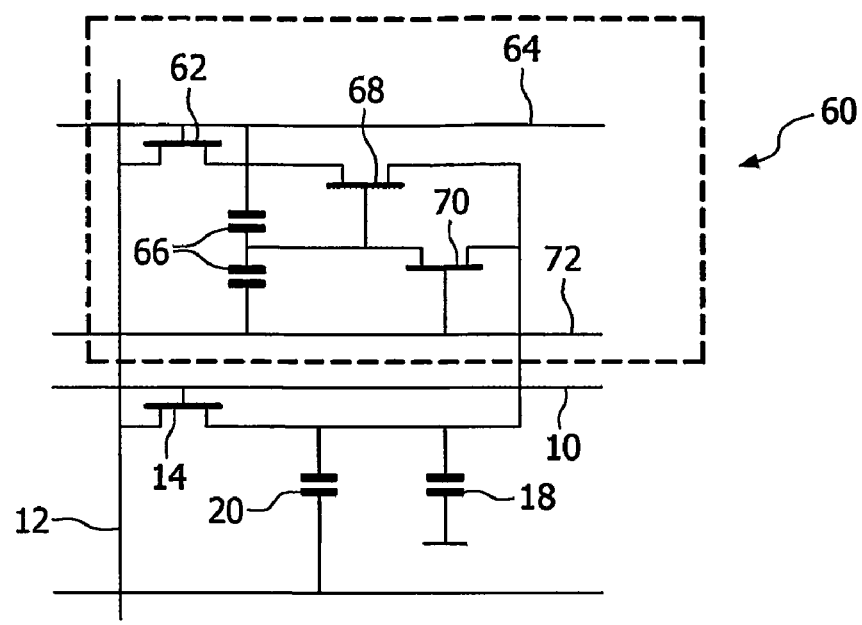
FIG. 24 shows schematically how the circuit of FIG. 23 can be modified to use the amplifier arrangement of the invention.

It is therefore advantageous to provide some amplification of the data signal present at the gate of transistor 68 as this will increase the robustness of the circuit to variations in capacitance and TFT characteristics. The amplification technique described above can readily be applied to this pixel circuit by replacing the capacitor 66 shown in FIG. 23 with two voltage-dependent capacitors, as shown in FIG. 24.

As shown, these are between the sense control line 72 and the refresh line 64. These two lines thus function as the voltage sources $V_A$ and $V_B$ for example as shown in FIG. 9. As described above, the voltages on these lines change during the refresh operation, and these changes can be used to provide the desired amplification at the output, namely the gate of transistor 68.

Figure 25:
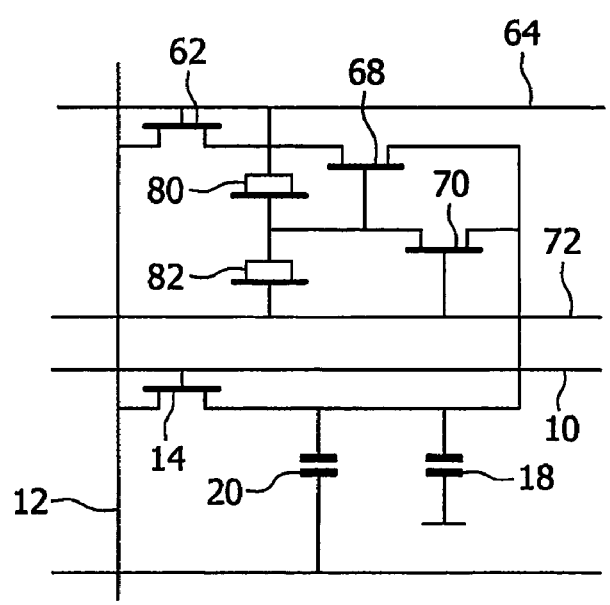
FIG. 25 shows an implementation of the circuit of FIG. 24.

The capacitors could be formed in various ways but a convenient method is to use the gate metal, gate insulator and an undoped or lightly doped layer of semiconductor. For example if the TFTs used in the pixel circuit are n-type polycrystalline silicon devices then it may be convenient to form the capacitors using n-type TFTs which have their source and drain terminals connected together as illustrated in FIG. 25.

The capacitance of the n-type TFTs at typical circuit operating frequencies has a low value when the voltage on the gate terminal relative to the source and drain terminals is less than the threshold voltage of the transistor and has a higher value when the gate voltage is greater than the threshold voltage. Transistors 80 and 82 in FIG. 25 are connected in such a way that they have a higher capacitance when the data voltage is transferred to them from the pixel capacitance, the sense period, and a lower capacitance when the data is being transferred back to the pixel capacitance in an inverted form, the refresh period.

This change in capacitance of 80 and 82 results from the change in voltage across the transistors caused by the sense and refresh control signals. During the sensing period the sense control signal is at a high level, for example 10V, and the refresh control signals is at a low level, for example −7V. Since the pixel data voltage levels are close to 0V and 5V the voltages on the sense and refresh electrodes are sufficient to ensure that both transistors 80 and 82 are in their higher capacitance state during this period.

During the refresh period the sense electrode is at a low voltage, −7V, and the refresh electrode is at a high level, 10V. This causes the voltage across 80 and 82 to fall below the point at which their capacitance decreases resulting in amplification of the data signal on the node of the circuit connected to the gate of transistor 68. This amplification has been investigated by means of circuit simulation for a particular example of a pixel circuit. In the case where capacitor 66 is formed from two capacitors which have fixed values, the data voltage levels at the gate of transistor 68 at the end of the refresh period were 2.87V and −0.28V. For the circuits illustrated in FIG. 24 and 25 where capacitor 66 is formed by two voltage-dependent capacitors the equivalent data voltage levels are 5.88V and −0.57V. This represents a factor of two increase in the amplitude of the data signal controlling the transistor 68.

The advantage that this brings can be viewed in a number of ways. It means that the pixel circuit is more tolerant of variations in the transistor characteristics, it is also more tolerant of variations in the capacitances associated with the pixel circuit, alternatively it provides an opportunity to reduce the amplitude of the data voltages supplied to the pixel which may result in a further reduction in operating power since the data voltage amplitude does not need to be sufficient to switch transistor 68 prior to amplification.

The technique described above may be applicable to a number of circuit functions including memory devices, particularly the readout or refreshing of dynamic memory cells, sensing and imaging devices, readout of signals from pixels, level shifting circuits, amplification of low level analogue or digital signals.

A number of different circuits have been shown, with different amplification responses. In each case, the circuit has a range of input voltages over which the gain of the circuit is constant. The circuit thus has a range of input voltages of at least 0.5V, and preferably at least 1V over which the circuit provides linear gain. The circuit is however operable over a wider range of input voltages.

A number of specific applications of the amplification circuit of the invention have been given, but it will be understood that the invention contemplates the use of the circuit of the invention in other additional applications.

The invention claimed is:

1. An amplification circuit, comprising: an input to which an input voltage is provided, a capacitor arrangement, and a switching arrangement; wherein: the capacitor arrangement includes:
   a first capacitor that is configured as a voltage-dependent capacitor having a first voltage-dependent capacitance, and
   a second capacitor, coupled to the first capacitor, that is configured as a voltage-dependent capacitor having a second voltage-dependent capacitance;
   the circuit is operable in two modes,
   a first mode in which the input voltage is provided to an input terminal of at least the first capacitor, and
   a second mode in which the switching arrangement causes charge to be redistributed between the first and second capacitors; and the switching arrangement is configured to receive a first gain-control signal that is arranged to change the capacitance of the first capacitor and a second gain-control signal that is arranged to change the capacitance of the second capacitor; and wherein the switching arrangement includes an input switch for selectively coupling the input voltage to the capacitor arrangement, and wherein in the first mode, the input switch couples the input voltage to the capacitor arrangement, and in the second mode, the input switch isolates the input voltage from the capacitor arrangement; and wherein in the second mode, at least one of the first and second gain-control signals change a voltage on a gain-control terminal of the first and/or second capacitor.

2. A circuit as claimed in claim 1, wherein the change in voltage is on the gain-control terminal of the first capacitor and results in a reduction in the capacitance of the first capacitor.

3. A circuit as claimed in claim 1, wherein the voltage on the gain-control terminal of each of the first and second capacitors is changed.

4. A circuit as claimed in claim 3, wherein the change in voltage on the gain-control terminal of the second capacitor results in a reduction in the capacitance.

5. A circuit as claimed in claim 3, wherein the voltage on the gain-control terminal of the first capacitor is increased and the voltage on the gain-control terminal of the second capacitor is decreased.

6. A circuit as claimed in claim 5, wherein the voltage on the gain-control terminal of the first capacitor is increased from below the input voltage to above the input voltage, and the voltage on the gain-control terminal of the second capacitor is decreased from above the input voltage to below the input voltage.

7. A circuit as claimed in claim 1, wherein the input switch is controlled by the voltage on the gain-control terminal of the first capacitor.

8. A circuit as claimed in claim 7, wherein the input switch includes a first transistor with a gate connected to the gain-control terminal of the first capacitor.

9. A circuit as claimed in claim 8, wherein in the second mode, a voltage on the gain-control terminal of the second capacitor is also changed, and wherein the input switch includes a second transistor in parallel with the first transistor, with a gate of the second transistor connected to the gain-control terminal of the second capacitor.

10. A circuit as claimed in claim 1, wherein the input terminal corresponds to the gain-control terminal of each of the first and second capacitors, the switching arrangement includes: a first switch or switches coupling the input voltage to the gain-control terminal of the first and second capacitors; second switches coupling the respective gain-control signals to the gain-control terminals of the first and second capacitors; and an input switch coupling a reference voltage to other terminals of the first and second capacitors.

11. A circuit as claimed in claim 10, wherein in the first mode, the first switch or switches and the input switch are closed, so that a voltage across the capacitors is dependent on the input voltage, and in the second mode, the second switches are closed and the output voltage comprises the voltage on the other terminals of the first and second capacitors.

12. A circuit as claimed in claim 10, wherein the first capacitor comprises a depletion n-type MOS device.

13. A circuit as claimed in claim 12, wherein the first and second capacitors comprise depletion n-type MOS devices.

14. A circuit as claimed in claim 1, wherein the input is connected to the input terminal of the first and second capacitors, and the respective gain-control voltages are coupled to the gain-control terminals of the first and second capacitors through respective control switches of the switching arrangement.

15. A circuit as claimed in claim 14, wherein the switching arrangement includes a shorting switch connected between the gain-control terminals of the first and second capacitors.

16. A circuit as claimed in claim 15, wherein in the first mode, the control switches are closed and the voltages across the capacitors is dependent on the input voltage, and in the second mode, the shorting switch is closed and the output voltage comprises the voltage on the gain-control terminals of the first and second capacitors.

17. A circuit as claimed in claim 1, wherein at least one of the first and second capacitors includes a transistor with source and drain connected together, and wherein one of the input terminal and gain-control terminal is defined by the gate and an other of the input and gain-control terminal is defined by the connected source and drain.

18. A circuit as claimed in claim 17, wherein the transistor of the at least one capacitor comprises a thin film MOS transistor.

19. An active matrix device comprising an array of device elements and circuitry for generating control signals for controlling the device elements, further comprising a circuit as claimed in claim 1 for increasing a voltage level of the control signals before supply to the device elements.

20. A device as claimed in claim 19, further comprising a latch circuit at the output of the amplification circuit.

21. An active matrix display device comprising an array of display pixels, each display element having pixel refresh circuitry comprising an amplification circuit as claimed in claim 1 for amplifying a gate voltage of a control transistor within the refresh circuitry.

22. A device as claimed in claim 21, wherein the refresh circuitry comprises sensing circuitry for storing a display pixel voltage on a storage capacitor arrangement and writing circuitry for providing a voltage to the display pixel in dependence on the stored display pixel voltage, wherein the writing circuitry comprises the control transistor the gate voltage of the control transistor being provided by the storage capacitor arrangement and wherein the storage capacitor arrangement comprises the capacitor arrangement of the amplification circuit.

23. An active matrix array device comprising an array of device elements, each device element in the array being provided with a circuit as claimed in claim 1.

24. A device as claimed in claim 23, wherein the device elements comprise memory cells, image sensing pixels, or display pixels.

* * * * *